United States Patent
La Rosa (10) Patent No.: US 6,897,689 B2
(45) Date of Patent: May 24, 2005

(54) PROGRAMMABLE POR CIRCUIT WITH TWO SWITCHING THRESHOLDS

(75) Inventor: Francesco La Rosa, Rousset (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/641,337

(22) Filed: Aug. 14, 2003

(65) Prior Publication Data

US 2004/0070430 A1 Apr. 15, 2004

(30) Foreign Application Priority Data

Aug. 16, 2002 (FR) .............................................. 0210350

(51) Int. Cl.⁷ ............................................................ H03L 7/00
(52) U.S. Cl. ..................................................... 327/143
(58) Field of Search ................................. 327/142, 143, 327/198

(56) References Cited

U.S. PATENT DOCUMENTS

| 5,831,460 A | 11/1998 | Zhou | 327/143 |
| 5,886,549 A | 3/1999 | Naura | 327/143 |
| 6,204,703 B1 * | 3/2001 | Kwon | 327/143 |
| 6,252,442 B1 | 6/2001 | Malherbe | 327/143 |
| 2001/0048328 A1 | 12/2001 | Sato | 327/143 |

FOREIGN PATENT DOCUMENTS

EP 0475066 3/1992 ............ H03G/3/00

* cited by examiner

Primary Examiner—Jeffrey Zweizig
(74) Attorney, Agent, or Firm—Lisa K. Jorgenson; Allen, Dyer, Doppelt, Milbrath & Gilchrist, P.A.

(57) ABSTRACT

A power on reset circuit (POR) includes a first reset circuit for delivering a first reset signal when a supply voltage of the POR circuit is between a first low threshold and a first high threshold, and a second reset circuit for delivering a second reset signal when the supply voltage is between a second low threshold and a second high threshold. The second high threshold is less than the first high threshold. The POR circuit further includes at least one electrically erasable and programmable non-volatile memory cell. A delivery circuit outputs the first reset signal or the second reset based upon whether the at least one electrically erasable and programmable non-volatile memory cell is in an erased or programmed state. The POR circuit has a threshold for outputting the first or second reset signal that is programmable according to the intended application.

35 Claims, 4 Drawing Sheets

PROGRAMMABLE POR CIRCUIT WITH TWO SWITCHING THRESHOLDS

FIELD OF THE INVENTION

The present invention relates to a circuit that resets to zero upon the occurrence of a supply voltage. This circuit is generally referred to as a power on reset (POR) circuit.

BACKGROUND OF THE INVENTION

When powered on, most integrated circuits comprising logic circuits, registers and flip-flops need to be reset to insure that their internal nodes do not have indeterminate logic states. This reset is done by a POR circuit, which delivers a signal RESET when the supply voltage is between two thresholds V1 and V2.

A POR circuit intervenes upon power-up (rise in the supply voltage) to deliver the signal RESET when the supply voltage reaches the threshold V1 and releases the signal RESET when the supply voltage reaches the threshold V2. The active value of the signal RESET may be 1 or 0 and the release of the signal RESET may therefore correspond to it being set to 0 or to 1.

A POR circuit also intervenes upon power-down (drop in the supply voltage) to deliver the signal RESET when the supply voltage becomes lower than the threshold V2. In fact, it is important to reset the logic circuits of an integrated circuit when the supply voltage drops below a determined minimum threshold, below which the proper operation of the integrated circuit is not insured. Below this threshold, certain elements may prove to be unstable or have indeterminate logic states. Certain operations can also be marred with errors, erasing or programming memory cells, for example.

Therefore, it is preferable to reset the integrated circuit to zero. The threshold V2 of the POR circuit is chosen to correspond to this minimum security threshold. Thus, the signal RESET is delivered each time the supply voltage goes below the threshold V2, whether it is when the integrated circuit is switched off or upon unintentional power-down.

When designing a POR circuit, the threshold V2 is generally chosen according to the characteristics of the application in which the integrated circuit is intended to be implemented. These characteristics are established by the user. For example, certain users may want the signal RESET to be sent when the voltage Vcc drops below a threshold V2 on the order of 2.5V while other users may want the signal RESET to be sent when the voltage Vcc drops below a threshold V2 on the order of 1.5 V. This requirement depends on the constraints imposed by the application. It can occur, for example, that the application comprises other integrated circuits that communicate with the integrated circuit concerned, and are likely to send invalid commands below a determined threshold V2. This is why it is preferable to reset the integrated circuit to zero below the threshold V2, even if the latter is capable of supporting lower supply voltages without malfunctioning.

The need to change the threshold V2 for sending the signal RESET according to the intended application leads to a diversification of the POR circuits and a corresponding diversification of the integrated circuits. Integrated circuits are often provided that can operate in a wide range of supply voltages, such as from 1.8 V to 5.5 V for example, but they need to be manufactured in two different versions. Each version includes a specific POR circuit having a threshold V2 compatible with the intended application.

SUMMARY OF THE INVENTION

In view of the foregoing background, an object of the present invention is to provide a POR circuit that can be incorporated into integrated circuits that can receive different supply voltages.

This and other objects, advantages and features in accordance with the present invention are provided by a POR circuit having a switching threshold that is programmable by a non-volatile memory cell.

More particularly, the present invention provides a POR circuit comprising means for delivering a first reset signal when the supply voltage of the POR circuit is between a first low threshold and a first high threshold, and means for delivering a second reset signal when the supply voltage is between a second low threshold and a second high threshold. The second high threshold is lower than the first high threshold. At least one electrically erasable and programmable non-volatile memory cell can be put into an erased state or into a programmed state. The POR circuit may further comprise means for delivering the first or the second reset signal to the output of the POR circuit, depending on whether the memory cell is in the erased state or in the programmed state.

The POR circuit may further comprise a select circuit for selecting one of the reset signals at the output of the POR circuit depending on the value of a select signal applied to the select circuit. The POR circuit may also further comprise a select control circuit for delivering the select signal, wherein the value of the select signal depends on the erased or programmed state of the memory cell.

The select control circuit may have a differential architecture, and may comprise two memory cells. Each memory cell is in either an erased or a programmed state, and is opposite the state of the other memory cell.

The select control circuit may comprise two PMOS transistors, for example. Each PMOS transistor has its gate connected to the drain of the other PMOS transistor, and its drain linked to one of the two memory cells. The select control circuit may further comprise a latch linked to the two memory cells. The select control circuit may also comprise a transistor for balancing the latch, and insulation transistors for enabling the latch to be insulated from the memory cells. The POR circuit may further comprise means for causing the balancing transistor to conduct while blocking the insulation transistors, and for blocking the balancing transistor and causing the insulation transistors to conduct.

The POR circuit may comprise means for logically combining the first and second reset signals. The means for delivering the first reset signal or the means for delivering the second reset signal may be arranged to be in an inhibited state or in an active state depending on the on or off state of the memory cell. The first and second reset signals may be combined by an AND logic function.

The means for delivering the second reset signal may be in an inhibited state or in an active state depending on the on or off state of the memory cell. The reset signal delivered by the POR circuit may be equal to the second reset signal when the means for delivering the second reset signal is not in the inhibited state, or equal to the first reset signal when the means for delivering the second reset signal is in the inhibited state.

The POR circuit may comprise a logic gate having a ground terminal linked to ground through the memory cell. The logic gate may be inhibited when the memory cell is in a state, either erased or programmed, corresponding to an off state of the memory cell. The logic gate is operational when the memory cell is in a state, either programmed or erased, corresponding to an on state of the cell. The output of the logic gate may be linked to the input of a latch. The output of the latch may be driven by an element arranged to force the output to a predetermined value when the logic gate is inhibited.

The memory cell in the POR circuit may comprise several floating-gate transistors arranged in parallel and having their floating gates interconnected. Alternatively, the memory cell in the POR circuit may comprise at least one erase and program accessible floating-gate transistor, and at least one floating-gate transistor that is read only accessible. The floating gate of the transistor that is read only accessible and the floating gate of the erase accessible transistor may be interconnected.

Another aspect of the present invention is directed to a method for delivering a reset signal to an integrated circuit, comprising the step of delivering a first reset signal when the supply voltage of the integrated circuit is between a first low threshold and a first high threshold. The method may further comprise delivering a second reset signal when the supply voltage is between a second low threshold and a second high threshold. The second high threshold is lower than the first high threshold. At least one electrically erasable and programmable non-volatile memory cell that can be put into an erased state or into a programmed state is provided. The first or the second reset signal is delivered depending on whether the memory cell is in the erased state or in the programmed state.

The at least one memory cell may comprise a pair of memory cells to determine which of the reset signals is delivered to the output of the POR circuit. Each memory cell of the pair is in a state, either erased or programmed, which is the opposite of the state of the other memory cell.

The method may comprise logically combining the first and second reset signals, and inhibiting delivery of the first reset signal or delivery of the second reset signal depending on the on or off state of the memory cell. The method may comprise logically combining the first and second reset signals using an AND logic function.

Inhibiting delivering of a reset signal may be performed by not electrically supplying a logic gate when the memory cell is in a state, either erased or programmed, corresponding to an off state of the memory cell. The method may further comprise arranging the memory cell between ground and a ground terminal of the logic gate. The logic gate may no longer be supplied when the memory cell is in a state, either erased or programmed, corresponding to an off state of the memory cell. The logic gate may be operational when the memory cell is in a state, either programmed or erased, corresponding to an on state of the memory cell.

BRIEF DESCRIPTION OF THE DRAWINGS

These and other objects, features and advantages of the present invention shall be explained in greater detail in the following description of example embodiments of POR circuits according to the present invention, given in relation with, but not limited to, the following figures.

DETAILED DESCRIPTION OF THE PREFERRED EMBODIMENTS

Figure 1:
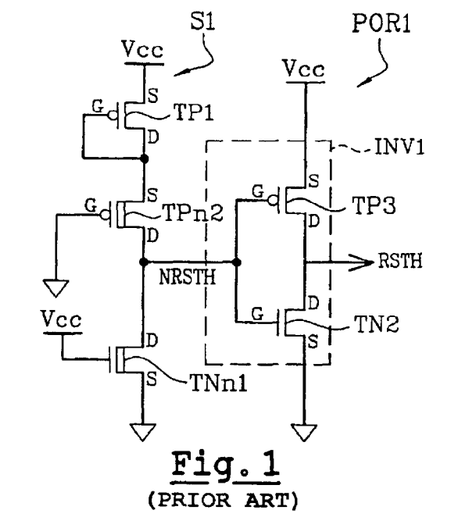
FIG. 1 is a circuit diagram of a first POR circuit according to the prior art.
Figure 2:
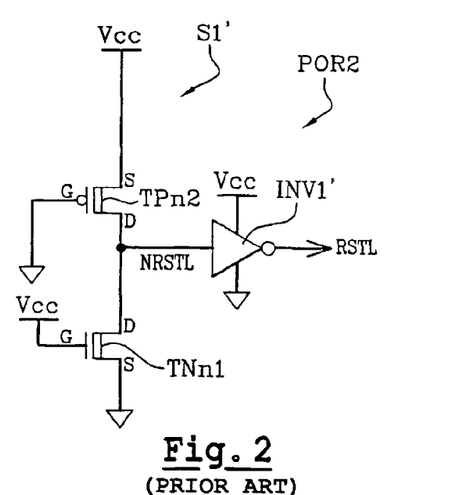
FIG. 2 is a circuit diagram of a second POR circuit according to the prior art.

FIGS. 1 and 2 represent two prior art POR circuits, respectively POR1 and POR2, to be arranged in an integrated circuit receiving a supply voltage Vcc. The circuit POR1 delivers a reset signal RSTH and has a high switching threshold V2H. The circuit POR2 delivers a reset signal RSTL and has a high switching threshold V2L lower than V2H. According to the present invention, these two circuits POR1, POR2 are combined to form a circuit POR3 with a programmable switching threshold that will be described below.

The structure of the circuits POR1, POR2 will be described first, as a non-restrictive example. In the following description, PMOS enhancement transistors are designated by TPx (x being a figure) and NMOS enhancement transistors are designated by TNx. Native-type PMOS transistors (with undoped channels) are designated by TPnx and native-type NMOS transistors are designated by TNnx.

The circuit POR1 comprises a switching stage S1 supplied by the voltage Vcc, and delivers a signal NRSTH. This signal is applied to the input of an inverting gate INV1, the output of which delivers the signal RSTH. The stage S1 comprises transistors TP1, TPn2, TNn1 in series. The transistor TP1 receives the voltage Vcc at its source. Its gate is connected to its drain that is connected to the source of the transistor TPn2. The transistor TPn2 has its drain connected to the drain of the transistor TNn1 and its gate is connected to ground. The transistor TNn1 receives the voltage Vcc at its gate and its source is connected to ground. The signal NRSTH is taken on the node that is common to the drains of the transistors TPn2, TNn1.

The gate INV1 is supplied by the voltage Vcc and comprises two transistors TP3, TN2 in series, each receiving the signal NRSTH at their gates and having their drains interconnected. The output signal RSTH is taken on the node that is common to the drains of these transistors.

The circuit POR2 comprises a switching stage S1' delivering a signal NRSTL. This signal is applied to the input of an inverting gate INV1' that is identical to the gate INV1 and the output of which delivers the signal RSTL. The stage S1' is identical to the stage S1 already described. The same elements are designated by the same references, except for the transistor TP1 that is removed. In this switching stage S1', the voltage Vcc is therefore applied to the source of the transistor TPn2.

Figure 3:
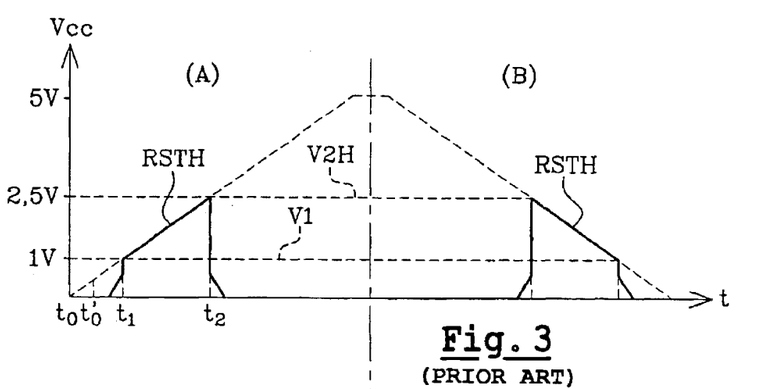
FIG. 3 is a graph representing reset signals delivered by the first POR circuit illustrated in FIG. 1.

In FIG. 3, part A represents the shape of the signal RSTH upon power-up, and part B represents the shape of the signal RSTH upon power-down. As a numerical example, it will be assumed that Vtn=0.8V, Vtp=1V, Vtnn=0.4V, and Vtpn=

1.5V. Vtp is the threshold voltage of the PMOS enhancement transistors, Vtn is the threshold voltage of the NMOS enhancement transistors, Vtpn is the threshold voltage of the native PMOS transistors, and Vtnn is the threshold voltage of the native NMOS transistors.

At an instant t0, the voltage Vcc starts to rise. At an instant t0', the voltage Vcc reaches 0.4V (Vtnn) and the transistor TNn1 goes to an on state. The signal NRSTH at the input of the gate INV1 goes to 0 (ground). At an instant t1, the voltage Vcc reaches 1V (Vtp) and the transistor TP3 of the gate INV1 goes to an on state, and the signal RSTH goes to 1. The threshold voltage Vtp therefore forms the low switching threshold V1 of the circuit POR1. At an instant t2, the voltage Vcc reaches 2.5 V (Vtp+Vtpn) and the two transistors TP1, TPn2 go to an on state. The transistor TP1 is arranged as a diode and the transistor TPn2 has its gate connected to ground. The signal RSTH goes back to 0. The sum of the threshold voltages Vtp+Vtpn of the PMOS transistors TP1, TPn2 therefore forms the high switching threshold V2H of the circuit POR1, here equal to 2.5 V.

Part B of FIG. 3 shows that the signal RSTH also goes to 1 when the voltage Vcc becomes lower than the threshold V2H. With reference to FIG. 3, part A, the circuit POR2 has the same low threshold V1 as the circuit POR1, but its high switching threshold V2L is equal to 1.5 V. In fact, the input of the gate INV1' goes to 1 (Vcc) and the signal RSTL goes to 0 when the voltage Vcc becomes higher than the threshold voltage Vtpn of the transistor TPn2, the latter then being in the on state (FIG. 2). Upon power-down, FIG. 3 part B, the input of the gate INV1' goes to 0 (ground) and the signal RSTL goes to 1 when the voltage Vcc becomes lower than the threshold voltage Vtpn of the transistor TPn2.

Figure 5:
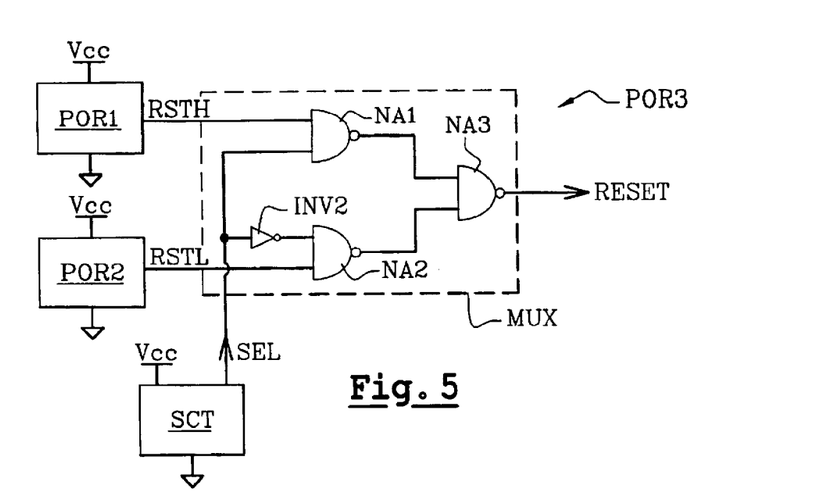
FIG. 5 is a circuit diagram of a first embodiment of a POR circuit according to the present invention.

FIG. 5 represents a circuit POR3 according to the present invention delivering a reset signal RESET. The circuit POR3 comprises the circuits POR1, POR2 described above, a select circuit MUX and a select control circuit SCT. The select control circuit SCT delivers a signal SEL applied to the circuit MUX. The select circuit MUX comprises three NAND-type gates NA1, NA2, NA3 each with two inputs, and an inverting gate INV2. The gate NA1 receives the signal SEL and the signal RSTH delivered by the circuit POR1 at its inputs. The gate INV2 receives the signal SEL and delivers an inverted signal NSEL. The gate NA2 receives the signal NSEL and the signal RSTL delivered by the circuit POR2. The outputs of the gates NA1, NA2 are applied to the gate NA3, which delivers the signal RESET. The signal RESET is therefore equal to:

RESET=RSTH*SEL+RSTL*NSEL

The operator * represents the logic AND and the operator +represent the logic OR.

Thus, the signal RESET copies the signal RSTH when SEL=1 (NSEL=0) and copies the signal RSTL when NSEL=1 (SEL=0). In other terms, the circuit POR3 has a high switching threshold V2H of 2.5 V when SEL=1 and a high switching threshold V2L of 1.5 V when SEL=0.

Figure 6A:
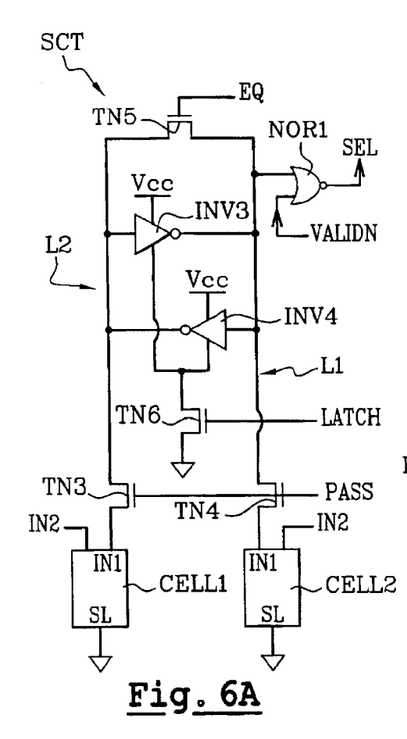
FIGS. 6A and 6B are circuit diagrams of two different embodiments of the select control circuit illustrated in FIG. 5.

FIG. 6A represents one embodiment of the select control circuit SCT according to the present invention. The circuit SCT is of a differential type and comprises two inverting gates INV3, INV4 head-to-tail connected and forming a latch, and two nonvolatile memory cells CELL1, CELL2. Each memory cell CELL1, CELL2 has one read input IN1, one erasing programming input IN2 and one source line SL to be connected to ground. The gate INV3 delivers a signal L1 and the gate INV4 delivers a signal L2. The input of the gate INV3, corresponding to the output of the gate INV4, is linked to the input IN1 of the cell CELL1 through a transistor TN3. The output of the gate INV3, corresponding to the input of the gate INV4, is linked to the input IN1 of the cell CELL2 through a transistor TN4. A transistor TN5 is arranged between the input and the output of the gate INV3. The gates INV3, INV4 receive the voltage Vcc on their supply terminal and their ground terminal is linked to ground through a transistor TN6. The transistors TN3, TN4 are driven by a signal PASS, the transistor TN5 is driven by a signal EQ and the transistor TN6 is driven by a signal LATCH. The signal SEL is delivered by a NOR-type gate NOR1 receiving the signal L1 or L2, here the signal L1 on one input and a signal VALIDN on another input.

The signals PASS, EQ, LATCH, VALIDN are delivered by a control circuit that is not represented here, such as the central processing unit of a microprocessor or a hard-wired logic sequencer, for example. This control circuit is programmed to load into the latch INV1/INV3 differential data logged in the cells CELL1, CELL2. Once the latch is loaded, the signal SEL is maintained by the latch and the transistors TN6, TN7 enable the memory cells CELL1, CELL2 to be insulated by taking the signal PASS to 0.

The circuit SCT is preferably configured before the integrated circuit, in which the circuit POR3 is arranged, such as during the final test phase prior to marketing the integrated circuit, for example. The cells CELL1, CELL2 are put into complementary states, one erased and the other programmed. This configuration is done according to the voltage Vcc that the integrated circuit is intended to receive.

It will be assumed that the cell CELL1 is programmed and that the cell CELL2 is erased. The cell CELL1 is therefore electrically conductive between its input IN1 and ground (source line SL), while the cell CELL2 is not conductive. When the voltage Vcc occurs, the input of the gate INV3 is pulled down so that the signal L1 goes to 1 (Vcc). In these conditions, the signal SEL goes to 1 if the gate NOR1 is transparent (VALIDN=0) and the signal RESET delivered by the circuit POR3 is the signal RSTH, that has a high switching threshold of 2.5 V in the example described above.

Conversely, if the cell CELL1 is erased and the cell CELL2 is programmed, it is the cell CELL2 that is electrically conductive. When the voltage Vcc occurs, the input of the gate INV4 is pulled down and the signal L1 goes to 0. In these conditions, the signal SEL goes to 0 if the gate NOR1 is transparent (VALIDN=0) and the signal RESET delivered by the circuit POR3 according to the present invention is the signal RSTL, which has a high switching threshold of 1.5 V in the example described above.

The advantage of this embodiment is that the memory cells CELL1, CELL2 are only used during a very short period of reading these cells and of loading the latch. The memory cells are therefore protected from spurious erasing that could occur if they were permanently exposed to a read voltage.

Since the voltage Vcc is necessary to load the latch, the circuit SCT can only be used to program the threshold V2 of the circuit POR3 after establishing the voltage Vcc. The choice of the high switching threshold V2H or V2L therefore only relates here to the generation of the signal RESET in a power-down phase. In a power-up phase the signal SEL is maintained on 0 by the gate NOR1 and of the signal VALIDN, which is maintained on 1.

Figure 9:
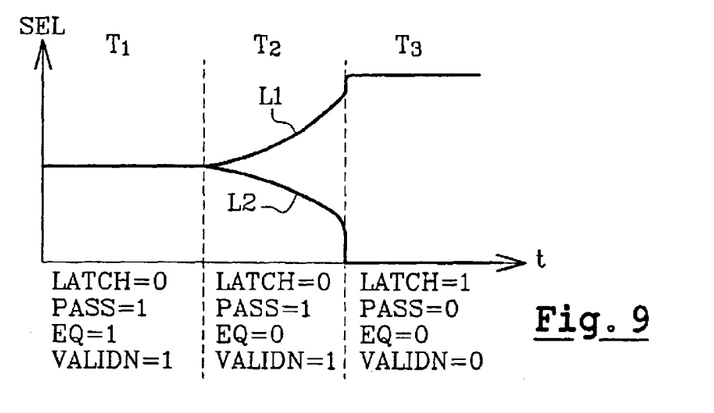
FIG. 9 is a graph illustrating operation of the select control circuit according to the present invention.

The activation of the circuit SCT, corresponding to the reading of the memory cells and the loading of the latch, comprises more particularly three phases shown in FIG. 9. These phases are as follows: Phase T1: LATCH=0, PASS=1, EQ=1, and VALIDN=1; Phase T2: LATCH=0, PASS=1, EQ=0, and VALIDN=1; and Phase T3: LATCH=1, PASS=0, EQ=0, and VALIDN=0.

The phase T1 is a phase of balancing the signals L1, L2. When transistor TN5 is on, L1 and L2 move towards the same value.

The phase T2 is a precharge phase that enables each signal to move towards its logic value, 1(Vcc) or 0 (ground), imposed by the differential data loaded into the memory cells. The signal L1 (SEL) moves towards 1 if the cell CELL1 is programmed and the cell CELL2 is erased, and moves towards 0 in the opposite case. The signal L2 moves towards the opposite logic value.

The phase T3 is a loading and locking phase in which the cells CELL1, CELL2 are insulated from the rest of the circuit (TN3, TN4 off) while the latch is made active by the change to 1 of the signal LATCH (transistor TN6 on). The gate NOR1 is made transparent during the phase T3, by taking the signal VALIDN to 0 immediately after the latch is made active. The signal SEL sets to a logic value that depends on the data loaded into the latch.

These three phases are triggered by the control circuit after the rise in the supply voltage Vcc (power-up). The signal RESET delivered to the integrated circuit when the voltage Vcc rises is the signal RSTL, as the default value of the signal SEL is 0. The activation of the select control circuit SCT can be caused, for example, in response to a select command received by the integrated circuit. The latch then receives the data that depends on the differential configuration of the memory cells CELL1, CELL2 and the signal VALIDN is set to 0. The circuit POR3 according to the present invention then reacts to a power-down according to the value of the signal SEL, to deliver the signal RESET when the voltage Vcc goes below the threshold V2H (signal RSTH) or the threshold V2L (signal RSTL).

Figure 6B:
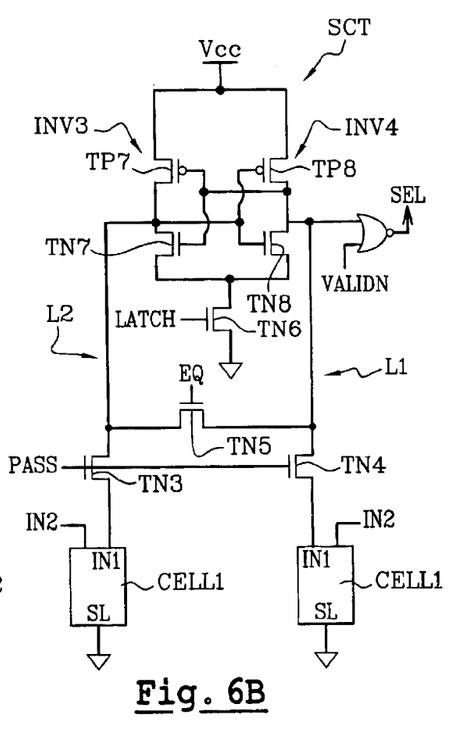

The wiring diagram of the circuit SCT is represented in FIG. 6B. The gate INV3 comprises two transistors TP7, TN7 in series, respectively of the PMOS and NMOS type, and the gate INV4 comprises two transistors TP8, TN8 in series, respectively of the PMOS and NMOS. In a precharge phase, the transistors TN3, TN4 are on and the transistors TN5 and TN6 are off. The transistors TN7, TN8 are floating. In the precharge phase, the circuit SCT therefore only comprises, as active elements, the PMOS transistors TP7, TP8 and the cells CELL1, CELL2. Each PMOS transistor has its gate G connected to the drain D of the other PMOS transistor, and its drain D connected to the input IN1 of a memory cell.

Figure 7:
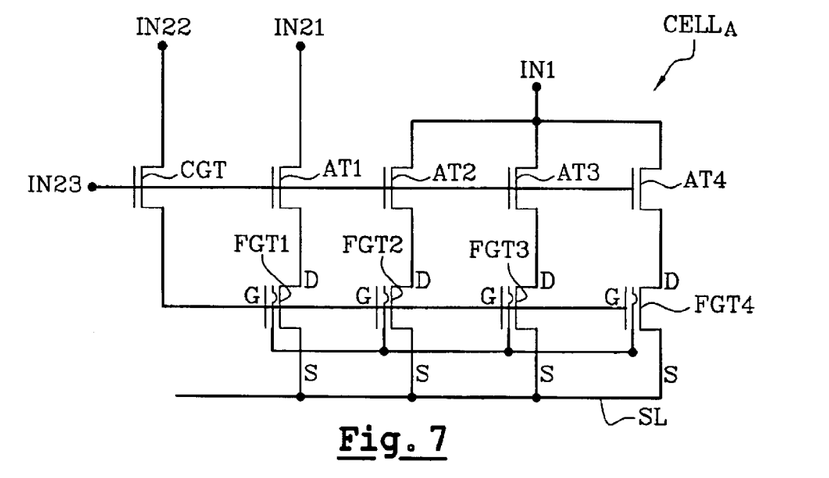
FIGS. 7 and 8 are circuit diagrams of two different embodiments of a memory cell in the select control circuit according to the present invention.

FIG. 7 represents an example of memory cell $CELL_A$ architecture applicable to each cell CELL1, CELL2 of the circuit SCT. The cell $CELL_A$ has a structure that is well known in itself, such as an EEPROM type. It comprises floating-gate transistors FGT1, FGT2, FGT3, FGT4, access transistors AT1, AT2, AT3, AT4 and a gate control transistor CGT. The floating-gate transistors FGT1 to FGT4 have their floating gates interconnected.

The erasing programming input IN2 of the cell $CELL_A$ comprises three inputs IN21, IN22, IN23. The control gates of the transistors FGT1 to FGT4 are linked to the input IN22 through the transistor CGT. The gates of the transistors AT1 to AT4 and the gate of the transistor CGT are linked to the input IN23. The drains of the transistors FGT2, FGT3, FGT4 are linked to the input IN1 through the access transistors, respectively AT2, AT3, AT4, while their sources are linked to a source line SL. The drain of the transistor FGT1 is linked to the input IN21 through the access transistor AT1, while its source is linked to the source line SL.

The operations of erasing and programming the memory cell $CELL_A$ comprise the injection or the extraction of electric charges in the floating gates by the tunnel effect. For this purpose, a high voltage Vpp on the order of 8 to 15 V (depending on the technology) is applied to the transistor FGT1. The erasing or the programming of the transistor FGT1 leads to the erasing or the programming of the transistors FGT2 to FGT4, the floating gates of which are connected to that of the transistor FGT1. The transistor FGT1 is, for example, programmed by applying the voltage Vpp to its drain through the access transistor AT1 while its gate is taken to ground through the transistor CGT. The transistor FGT1 is, for example, erased by applying the voltage Vpp to its gate while its source is taken to ground. Various other methods of erasing or programming may be provided by those skilled in the art.

Preferably, these operations of erasing and programming are not made available to the end user. They are performed by the manufacturer during a test phase of the integrated circuit, before it is fielded.

Once the operations of erasing and programming have been performed, the cell is put into a read configuration. The input IN21 is taken to a high impedance. The input IN22 is connected to ground. The input IN23 receives a bias voltage equal or proportional to Vcc. The source line SL is connected to ground. In this configuration, the cell is on or off between the input IN1 and the source line (ground) depending on whether it has been programmed or erased.

The connections enabling the read configuration to be implemented are of a dynamic type and are controlled by a specific element provided in the integrated circuit, such as one part of an EEPROM memory decoder, for example. In this case, the cell only becomes read accessible after the rise in the voltage Vcc, when the specific element is operational. The choice of the threshold V2H or V2L for sending the signal RESET relates to the power-down phases. In practice, this only has a relative importance since, as explained above, the need to choose a high switching threshold V2 corresponding to the intended application mainly corresponds to a need to reset to zero during the power-down phase. The value 0 is imposed by default on the signal SEL upon power-up, by the signal VALIDN, as described above.

Figure 8:
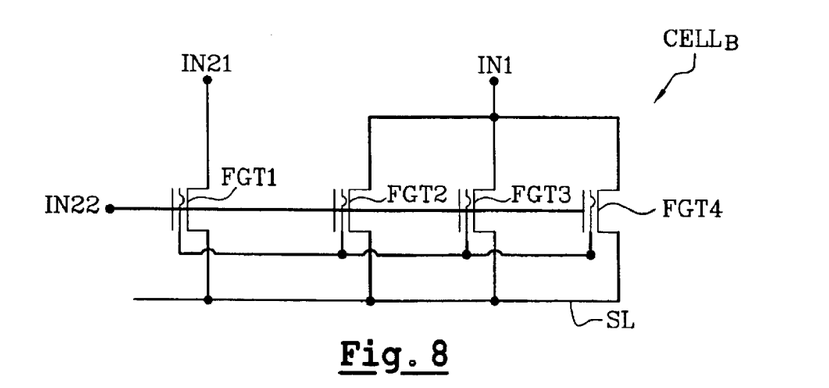

FIG. 8 represents another example of a memory cell $CELL_B$ architecture applicable to the cells CELL1, CELL2 of the circuit SCT. The cell $CELL_B$ is of the FLASH type and does not comprise access transistors and gate control transistors. The floating-gate transistors FGT1, FGT2, FGT3, FGT4 are linked to the read input IN1. The erasing/programming input IN2 of the cell $CELL_B$ comprises one input IN21 and one input IN22. The drain of the transistor FGT1 is linked to the input IN21. The control gates of the transistors FGT1 to FGT4 are linked to the input IN22. The programming of the transistor FGT1 is performed by hot carrier injection instead of by the tunnel effect, while it is erased by the tunnel effect. As the floating gates of the other transistors FGT are connected as above for the transistor FGT1, the erasing or the programming of the transistor FGT1 leads to the erasing or the programming of the other transistors FGT.

Preferably, the transistors TN3, TN4 of the circuit SCT (FIGS. 6A, 6B) are used as cascode transistors to prevent the application of an excessively high voltage to the drains of the floating-gate transistors of the cells $CELL_A$ or $CELL_B$. Such a voltage could, in fact, lead to them being spuriously erased (if they are in the programmed state). For that purpose, a specific bias circuit can be provided to control the value in voltage of the signal PASS applied to the gates of the transistors TN3, TN4, which must not exceed a certain value, such as 2V, for example.

Variations of the memory cells CELL1, CELL2 of the circuit POR3 according to the present invention may be made. The provision in each cell of several floating-gate transistors connected in parallel to the read input IN1 allows a current of sufficient intensity to switch the latch INV3/INV4 to be drained. However, it remains possible to provide a memory cell that only comprises a single floating-gate transistor connected to the read input IN1, if this transistor is provided to drain a substantial current.

The cells CELL1, CELL2 can be integrated into an EEPROM or FLASH memory array comprising various other memory cells. The cells CELL1, CELL2 may also be elements of an integrated circuit configuration register, comprising other non-volatile memory cells used to define the parameters of certain electrical characteristics of the integrated circuit.

It will be understood by those skilled in the art that variations of the circuit POR3 according to the present invention may be made. Therefore, in the description above, the signal RESET is obtained by selecting the two signals SRTH, RSTL by the circuit MUX. However, the signal RESET can also be obtained by logically combining the two signals RSTH, RSTL and inhibiting one of the signals according to the state of the memory cell.

Figure 10:
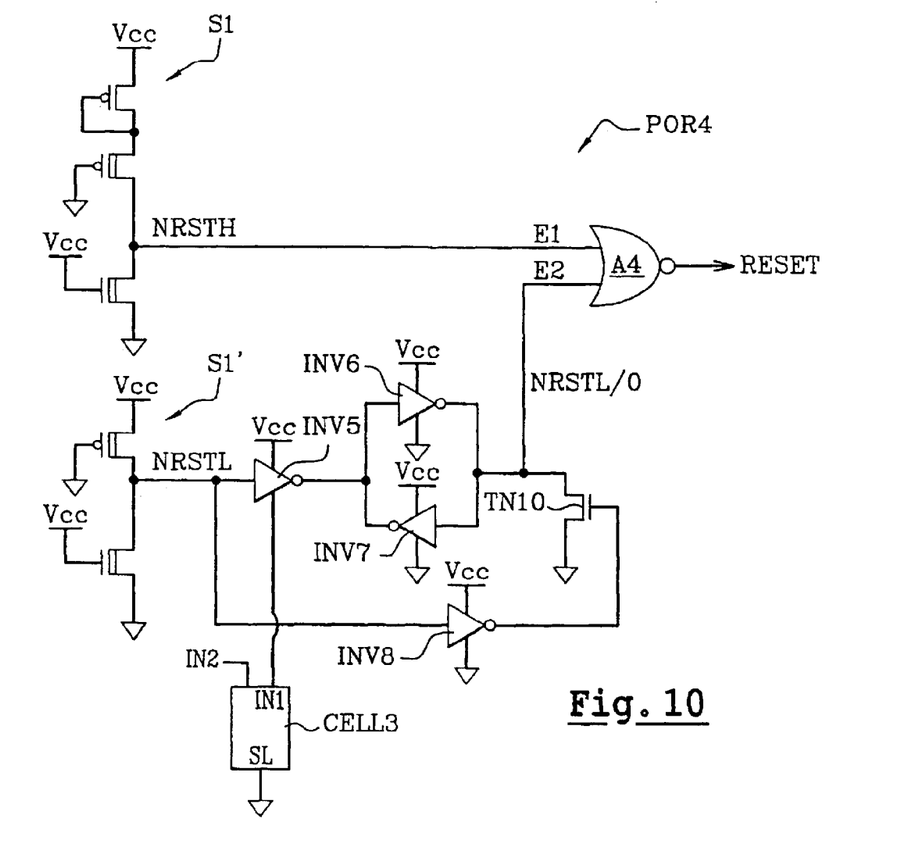
FIG. 10 is a circuit diagram of a second embodiment of a POR circuit according to the present invention.

FIG. 10 represents a circuit POR4 showing this other embodiment. The circuit POR4 comprises the two switching stages S1, S1' described above, respectively delivering the signals NRSTH and NRSTL. It also comprises a NOR-type gate A4 with two inputs E1, E2, the output of which delivers the signal RESET. The signal NRSTH is applied to the input E1 of the gate A4 while the signal NRSTL is applied to an inverting gate INV5. The output of the gate INV5 is applied to the input of a latch comprising two inverting gates INV6, INV7 connected head-to-tail. The output of the latch is applied to the input E2 of the gate A4.

The gates INV5 to INV7 are all supplied by the voltage Vcc. However, the ground terminal of the gate INV5 is linked to ground through a memory cell CELL3. The memory cell CELL3 is of the type described above, and conforms to one of the cells $CELL_A$ or $CELL_B$, for example. It has a read input IN1 connected to the ground terminal of the gate INV5 and an erasing programming input IN2.

When the cell is programmed and is therefore on, the gate INV5 is electrically supplied. The signal NRSTL is copied via the gate INV5 and the latch INV6/INV7 on the input E2 of the gate A4. In this case, the signal RESET delivered by the circuit POR4 is equal to:

RESET=/(NRSTH+NRSTL)=/NRSTH*/NRSTL i.e.:

RESET=RSTH*RSTL

The signal RESET is therefore the result of combining, by an AND function, the two reset signals RSTH and RSTL.

Figure 4:
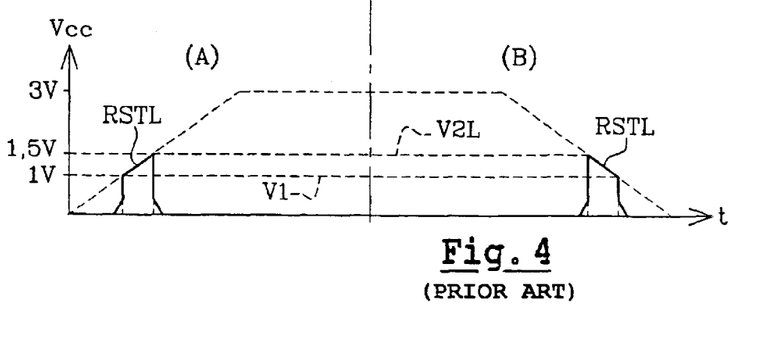
FIG. 4 is a graph representing reset signals delivered by the second POR circuit illustrated in FIG. 2.

Referring now to FIGS. 3 and 4, it can be seen that in the presence of a positive or negative ramp of the voltage Vcc, the duration of the signal RSTL is shorter than the signal RSTH, since it has a high switching threshold V2L that is lower than the threshold V2H of the signal RSTH. Hence, the signal RESET copies the signal RSTL since the signal RESET cannot be on 1 while the signal RSTL is not on 1 itself. In other terms, the signal RESET is equal to the signal RSTL when the memory cell CELL3 is programmed.

When the memory cell CELL3 is in the erased state and is therefore not on, the gate INV5 is not supplied and its output is at high impedance. To force the input E2 of the gate A4 to zero, a transistor TN10 is provided between the output of the latch INV6/INV7 and ground. This transistor is driven by the output of an inverting gate INV8 supplied by the voltage Vcc, which receives the signal NRSTL at its input. Thus, when the signal NRSTL goes to 1, the transistor TN10 goes into an on state and forces the output of the latch and the input E2 of the gate A4 to zero. The signal RESET delivered by the circuit POR4 is in this case equal to:

RESET=/(NRSTH+0)=/NRSTH*/0=/NRSTH*1=/NRSTH i.e.:

RESET=RSTH

In summary, the signal RESET is equal to the signal RSTH when the memory cell CELL3 is erased, and is equal to the signal RSTL when the memory cell CELL3 is programmed.

It should be noted that the selection between the two levels V2L, V2H of triggering the signal RESET can be performed in this embodiment not only during the power-down phase, but also during the power-up phase. In this case, the source line SL of the memory cell CELL3 is connected to ground and the cell is in the selected state. The cell is selected by applying determined voltages to the inputs IN22 and IN23 in FIG. 7, or to the input IN22 in FIG. 8. This selection can be performed automatically by the decoders of a memory array in which the cell CELL3 can be arranged. This can be done easily by controlling the signal RESET itself using a source line switch and a line decoder. In this case, when the signal RESET goes back to 0, the memory cell CELL3 is no longer selected but the state of the cell remains stored by the latch INV6/INV7.

It will be understood by those skilled in the art that variations of the circuits POR3 and POR4 that have just been described may be made, particularly as far as the active value of the signal RESET, the logic gates used, the structure of the switching stages S1, S1', the structure of the memory cell or of the memory cells used, as well as the other components of these circuits are concerned.

That which is claimed is:

1. A power on reset (POR) circuit comprising:
   first reset means for generating a first reset signal when a supply voltage of the POR circuit is between a first low threshold and a first high threshold;
   second reset means for generating a second reset signal when the supply voltage is between a second low threshold and a second high threshold, the second high threshold being less than the first high threshold;
   at least one electrically erasable and programmable non-volatile memory cell; and
   delivery means for outputting the first reset signal or the second reset based upon whether said at least one electrically erasable and programmable non-volatile memory cell is in an erased or programmed state.

2. A POR circuit according to claim 1, wherein said delivery means comprises:
   a select circuit having an input for receiving a select signal, and for selecting the first or second reset signal based upon a value of the select signal; and
   a select control circuit for providing the select signal to said select circuit, with the value of the select signal being based upon the erased or programmed state of said at least one electrically erasable and programmable non-volatile memory cell.

3. A POR circuit according to claim 2, wherein said select control circuit has a differential architecture and includes said at least one electrically erasable and programmable non-volatile memory cell, said at least one electrically erasable and programmable non-volatile memory cell comprising:
- a first memory cell in an erased or programmed state; and
- a second memory cell in an erased or programmed state opposite the state of said first memory cell.

4. A POR circuit according to claim 3, wherein said select control circuit further comprises:
- a first PMOS transistor comprising a gate, and a drain connected to said first memory cell; and
- a second PMOS transistor comprising a gate, and a drain connected to said second memory cell;
- the gate of said first PMOS transistor being connected to the drain of said second PMOS transistor, and the gate of said second PMOS transistor being connected to the drain of said first PMOS transistor.

5. A POR circuit according to claim 3, wherein said select control circuit further comprises at least one latch connected to said first and second memory cells.

6. A POR circuit according to claim 5, wherein said select control circuit further comprises:
- a balancing transistor for balancing said at least one latch; and
- first and second insulation transistors connected to said first and second memory cells for enabling said at least one latch to be insulated from said first and second memory cells.

7. A POR circuit according to claim 6, wherein said balancing transistor is conducting when said first and second insulation transistors are not conducting, and said balancing transistor is not conducting when said first and second insulation transistors are conducting.

8. A POR circuit according to claim 1, wherein said delivery means comprises a logic circuit receiving the first and second reset signals; and wherein said first and second reset means are in either an inhibited or active state depending on whether said at least one electrically erasable and programmable non-volatile memory cell is in the erased or programmed state.

9. A POR circuit according to claim 8, wherein said logic circuit performs an AND logic function.

10. A POR circuit according to claim 8, wherein said second reset means is in an inhibited or active state depending on whether said at least one electrically erasable and programmable non-volatile memory cell is in the erased or programmed state; and wherein said delivery means outputs the second reset signal when said second reset means is in an active state, and outputs the first reset signal when said second reset means is in an inhibited state.

11. A POR circuit according to claim 8, wherein said delivery means further comprises a logic gate having a reference terminal connected to a reference voltage through said at least one electrically erasable and programmable non-volatile memory cell, said logic gate being inhibited when said at least one electrically erasable and programmable non-volatile memory cell corresponds to an off state, and said logic gate being active when said at least one electrically erasable and programmable non-volatile memory cell corresponds to an on state.

12. A POR circuit according to claim 11, wherein said delivery means further comprises:
- at least one latch having an input connected to an output of said logic gate; and
- an element for driving said at least one latch for. forcing an output thereof to a predetermined value when said logic gate is inhibited.

13. A POR circuit according to claim 1, wherein said at least one electrically erasable and programmable non-volatile memory cell comprises a plurality of floating-gate transistors connected in parallel, each floating-gate transistor comprising a floating gate connected to the floating gates of the other floating-gate transistors.

14. A POR circuit according to claim 1, wherein said at least one electrically erasable and programmable non-volatile memory cell comprises:
- at least one erase and program accessible floating-gate transistor; and
- at least one floating-gate transistor that is only read accessible;
- each floating-gate transistor comprising a floating gate connected to the floating gates of the other floating-gate transistors.

15. A power on reset (POR) circuit comprising:
- a first reset circuit for generating a first reset signal when a supply voltage of the POR circuit is between a first low threshold and a first high threshold;
- a second reset circuit for generating a second reset signal when the supply voltage is between a second low threshold and a second high threshold, the second high threshold being less than the first high threshold;
- at least one memory cell; and
- a delivery circuit for outputting the first reset signal or the second reset based upon a state of said at least one memory cell.

16. A POR circuit according to claim 15, wherein said at least one memory cell comprises at least one non-volatile memory cell.

17. A POR circuit according to claim 15, wherein said delivery circuit comprises:
- a select circuit having an input for receiving a select signal, and for selecting the first or second reset signal based upon a value of the select signal; and
- a select control circuit for providing the select signal to said select circuit, with the value of the select signal being based upon the erased or programmed state of said at least one memory cell.

18. A POR circuit according to claim 17, wherein said select control circuit has a differential architecture and includes said at least one memory cell, said at least one memory cell comprising:
- a first memory cell in an erased or programmed state; and
- a second memory cell in an erased or programmed state opposite the state of said first memory cell.

19. A POR circuit according to claim 18, wherein said select control circuit further comprises:
- a first PMOS transistor comprising a gate, and a drain connected to said first memory cell; and
- a second PMOS transistor comprising a gate, and a drain connected to said second memory cell;
- the gate of said first PMOS transistor being connected to the drain of said second PMOS transistor, and the gate of said second PMOS transistor being connected to the drain of said first PMOS transistor.

20. A POR circuit according to claim 19, wherein said select control circuit further comprises at least one latch connected to said first and second memory cells.

21. A POR circuit according to claim 20, wherein said select control circuit further comprises:
- a balancing transistor for balancing said at least one latch; and first and second insulation transistors connected to said first and second memory cells for enabling said at least one latch to be insulated from said first and second memory cells.

22. A POR circuit according to claim 21, wherein said balancing transistor is conducting when said first and second insulation transistors are not conducting, and said balancing transistor is not conducting when said first and second insulation transistors are conducting.

23. A POR circuit according to claim 15, wherein said delivery circuit comprises a logic circuit receiving the first and second reset signals; and wherein said first and second reset circuits are in either an inhibited or active state depending on whether said at least one memory cell is in an erased or programmed state.

24. A POR circuit according to claim 23, wherein said logic circuit performs an AND logic function.

25. A POR circuit according to claim 15, wherein said second reset circuit is in an inhibited or active state depending on whether said at least one memory cell is in an erased or programmed state; and wherein said delivery circuit outputs the second reset signal when said second reset circuit is in an active state, and outputs the first reset signal when said second reset circuit is in an inhibited state.

26. A POR circuit according to claim 15, wherein said delivery circuit further comprises a logic gate having a reference terminal connected to a reference voltage through said at least one memory cell, said logic gate being inhibited when said at least one memory cell corresponds to an off state, and said logic gate being active when said at least one memory cell corresponds to an on state.

27. A POR circuit according to claim 26, wherein said delivery circuit further comprises:
at least one latch having an input connected to an output of said logic gate; and
an element for driving said at least one latch for forcing an output thereof to a predetermined value when said logic gate is inhibited.

28. A POR circuit according to claim 15, wherein said at least one memory cell comprises a EEPROM type memory cell.

29. A POR circuit according to claim 15, wherein said at least one memory cell comprises a FLASH type memory cell.

30. A method for delivering a reset signal to an integrated circuit, the method comprising:
generating a first reset signal when a supply voltage of the integrated circuit is between a first low threshold and a first high threshold;
generating a second reset signal when the supply voltage is between a second low threshold and a second high threshold, the second high threshold being less than the first high threshold; and
outputting the first reset signal or the second reset to the integrated circuit based upon on a state of at least one memory cell.

31. A method according to claim 30, wherein the at least one electrically erasable and programmable non-volatile memory cell comprises:
a first memory cell in an erased or programmed state; and
a second memory cell in an erased or programmed state opposite the state of the first memory cell.

32. A method according to claim 30, wherein the outputting comprises:
logically combining the first and second reset signals; and
inhibiting delivery of the first reset signal or inhibiting delivery of the second reset signal based upon whether the at least one memory cell corresponds to an on or off state.

33. A method according to claim 32, wherein logically combining the first and second reset signals is performed using an AND logic function.

34. A method according to claim 33, wherein the inhibiting comprises not providing electrical power to a logic gate when the at least one memory cell corresponds to an off state.

35. A method according to claim 34, wherein the logic gate has a voltage reference terminal, and the at least one memory cell is connected between a voltage reference and the voltage reference terminal of the logic gate; and wherein the inhibiting comprises inhibiting the logic gate when the at least one memory cell corresponds to an off state, and causing the logic gate to be active when the at least one memory cell corresponds to an on state.

* * * * *